(12) United States Patent
Imai et al.

(10) Patent No.: US 12,433,097 B2
(45) Date of Patent: Sep. 30, 2025

(54) METHOD OF MANUFACTURING DISPLAY DEVICE

(71) Applicant: Magnolia White Corporation, Tokyo (JP)

(72) Inventors: Nobuo Imai, Tokyo (JP); Kaichi Fukuda, Tokyo (JP); Takashi Tsuchiya, Tokyo (JP); Hiroshi Ogawa, Tokyo (JP); Yuya Yamamoto, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 330 days.

(21) Appl. No.: 18/173,069

(22) Filed: Feb. 23, 2023

(65) Prior Publication Data
US 2023/0276657 A1    Aug. 31, 2023

(30) Foreign Application Priority Data

Feb. 28, 2022   (JP) .................. 2022-029571

(51) Int. Cl.
*H10K 59/12* (2023.01)
*H10K 59/122* (2023.01)
*H10K 71/20* (2023.01)

(52) U.S. Cl.
CPC ....... *H10K 59/1201* (2023.02); *H10K 59/122* (2023.02); *H10K 71/231* (2023.02)

(58) Field of Classification Search
CPC . H10K 71/231; H10K 59/122; H10K 59/1201
See application file for complete search history.

(56) References Cited

U.S. PATENT DOCUMENTS

| 9,559,154 | B2 * | 1/2017 | Ishii | ................... H10K 50/8428 |
| 2004/0160170 | A1 | 8/2004 | Sato et al. | |
| 2009/0009069 | A1 | 1/2009 | Takata | |
| 2011/0101888 | A1 * | 5/2011 | Uchida | ................ H10K 71/441 438/34 |
| 2012/0286281 | A1 * | 11/2012 | You | ........................ H10D 86/60 438/34 |
| 2019/0363275 | A1 | 11/2019 | Ochi et al. | |

FOREIGN PATENT DOCUMENTS

| JP | 2000-195677 A | 7/2000 |
| JP | 2004-207217 A | 7/2004 |
| JP | 2008-135325 A | 6/2008 |
| JP | 2009-32673 A | 2/2009 |
| JP | 2010-118191 A | 5/2010 |
| WO | 2018/179308 A1 | 10/2018 |

* cited by examiner

*Primary Examiner* — Steven M Page
(74) *Attorney, Agent, or Firm* — XSENSUS LLP

(57) ABSTRACT

According to one embodiment, a method of manufacturing a display device includes forming a lower electrode, forming an insulating layer covering the lower electrode, forming a partition including a lower portion on the insulating layer and an upper portion protruding from a side surface of the lower portion, forming, after the forming of the partition, a pixel aperture in the insulating layer, forming an organic layer in contact with the lower electrode via the aperture, forming an upper electrode which covering the organic layer and patterning the organic layer and the upper electrode to form a display element.

19 Claims, 17 Drawing Sheets

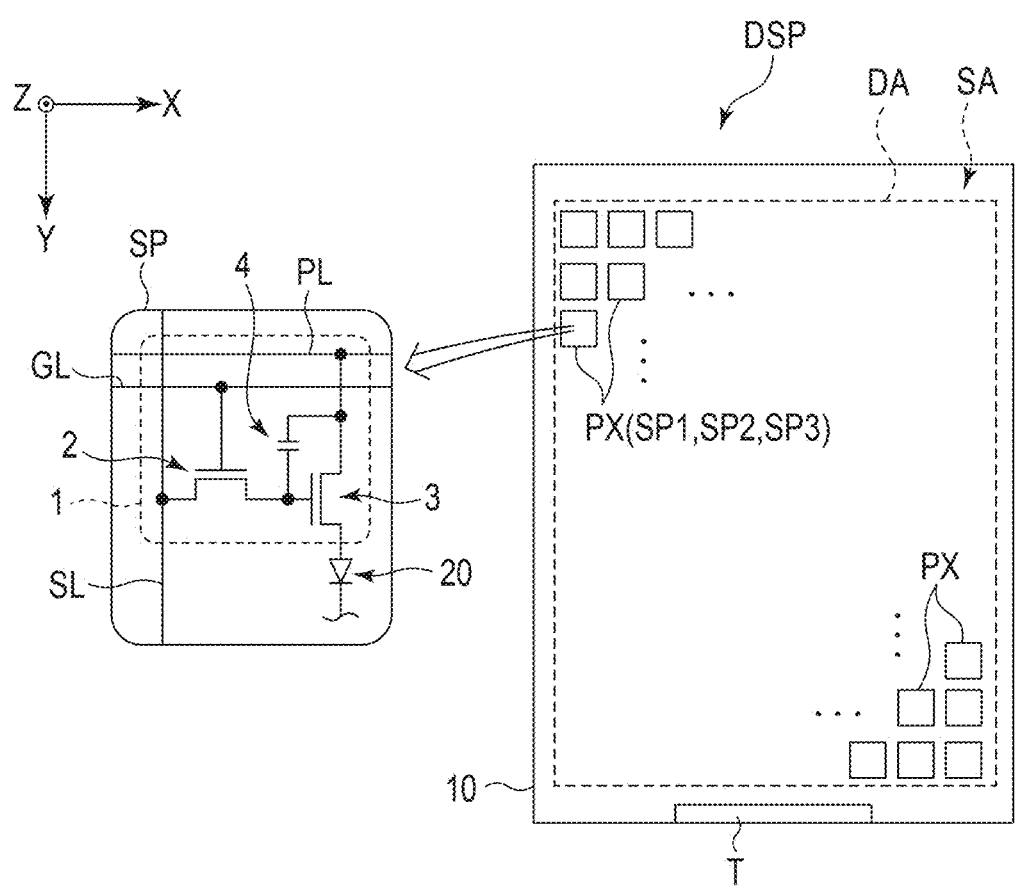
F I G. 1

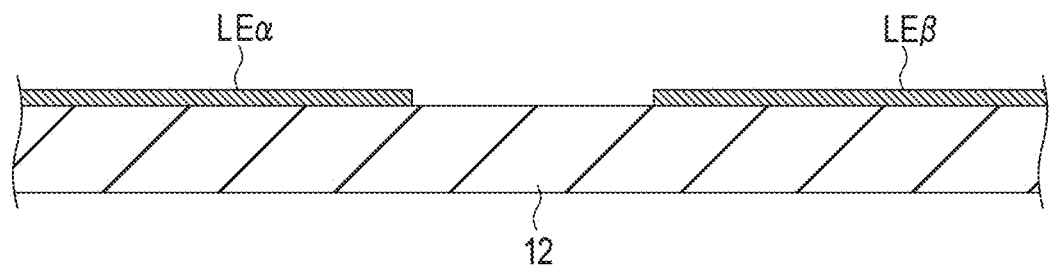
F I G. 8
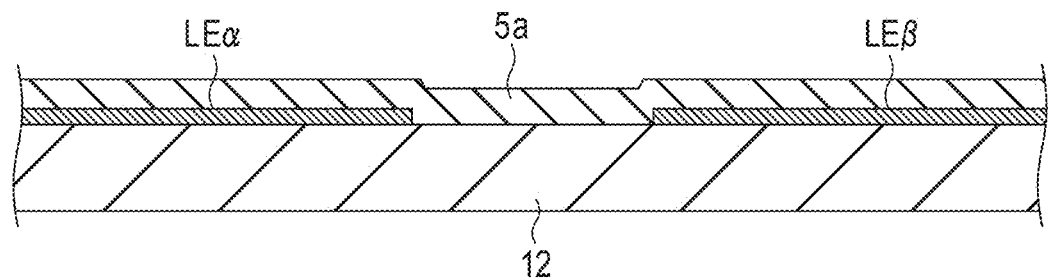
F I G. 9
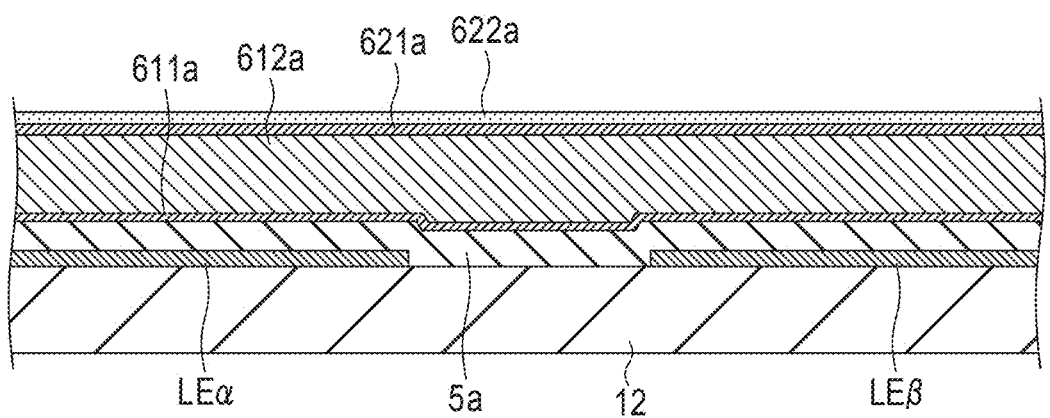
F I G. 10

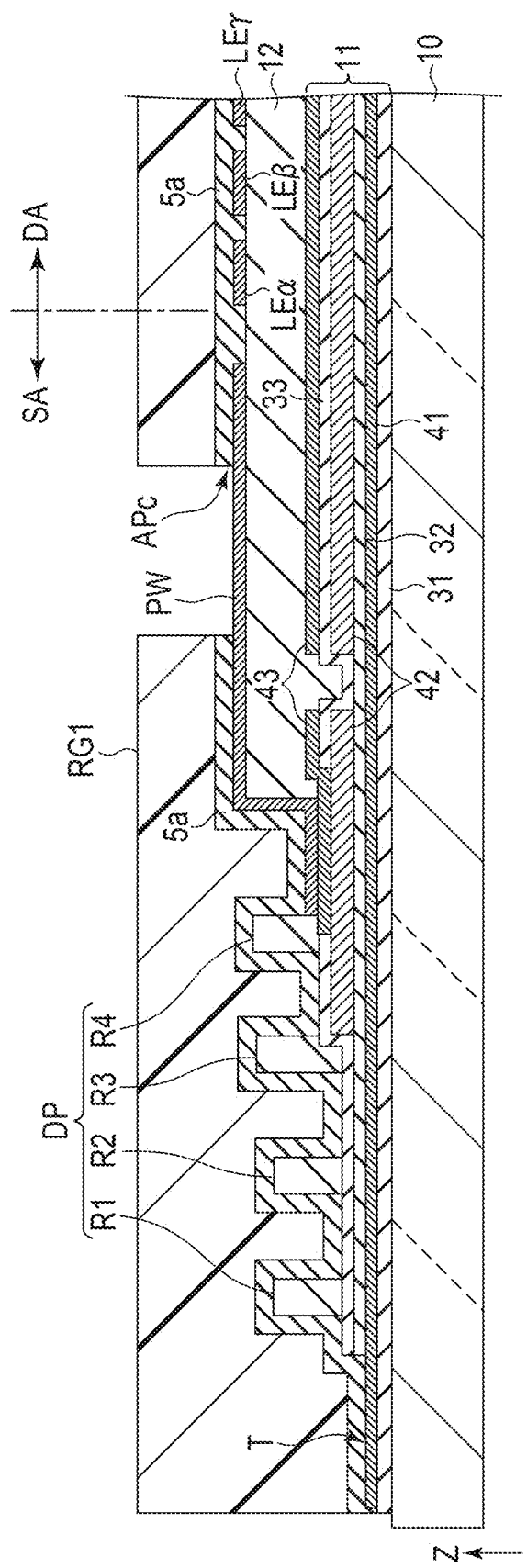
F I G. 16

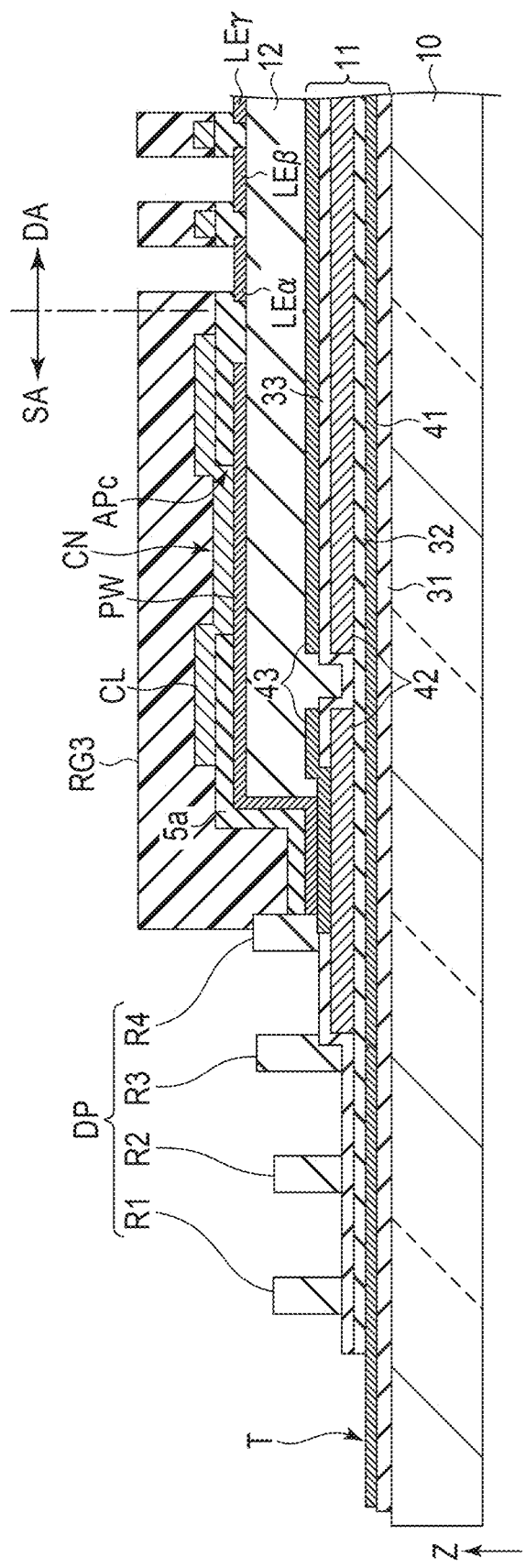
F I G. 17

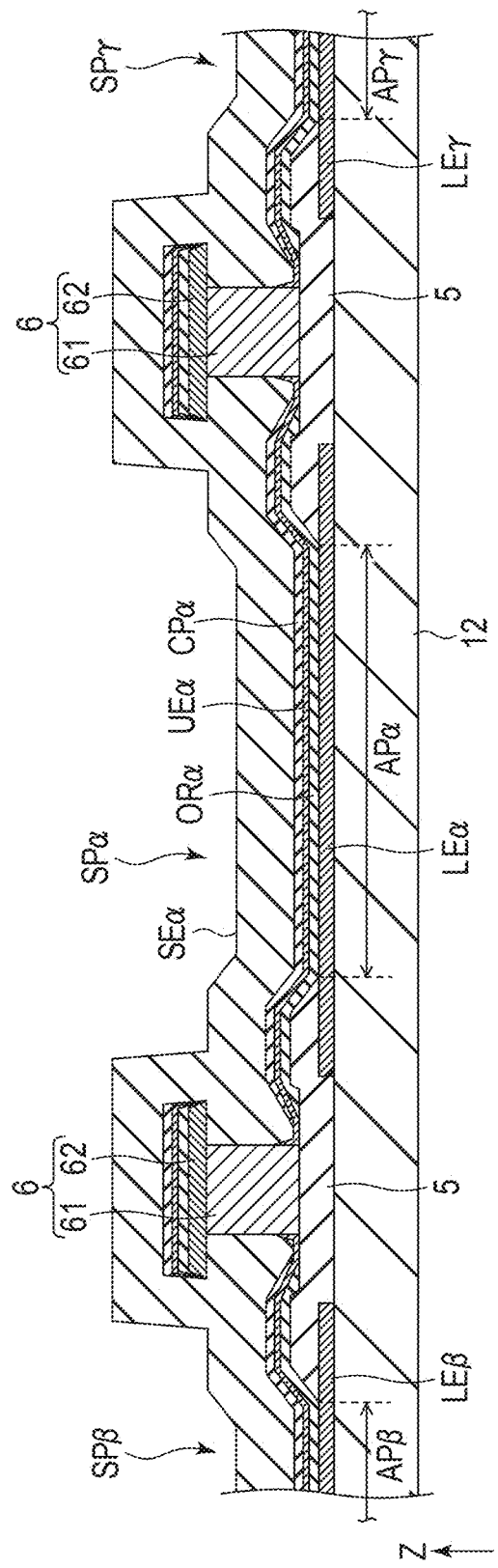
F I G. 18

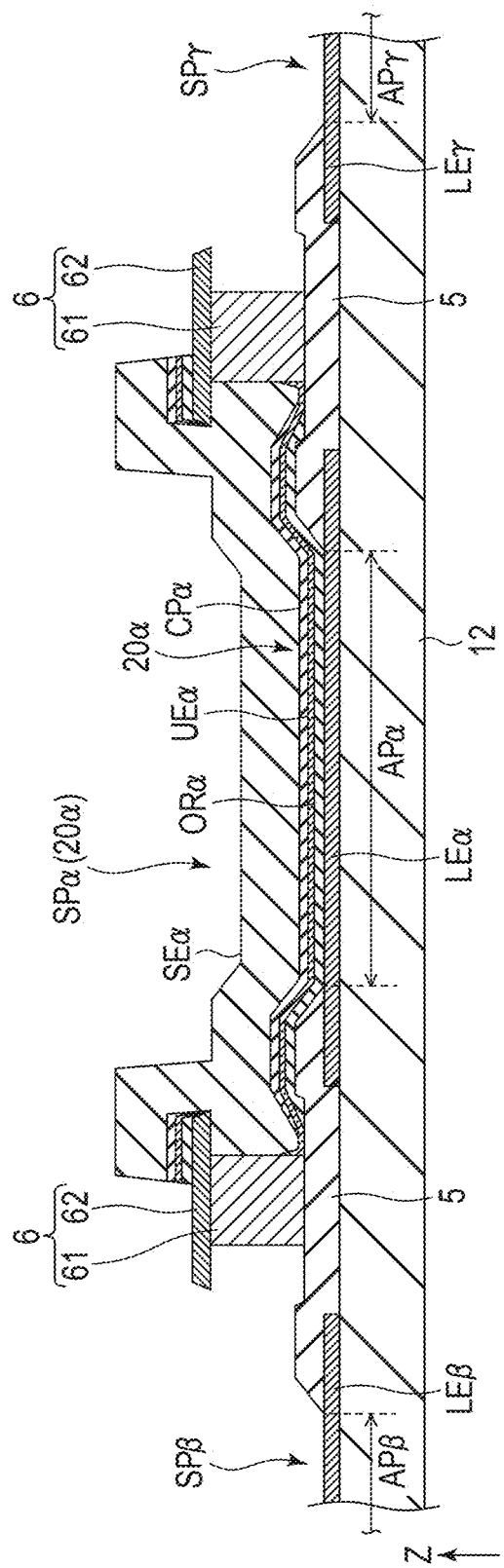
F I G. 21

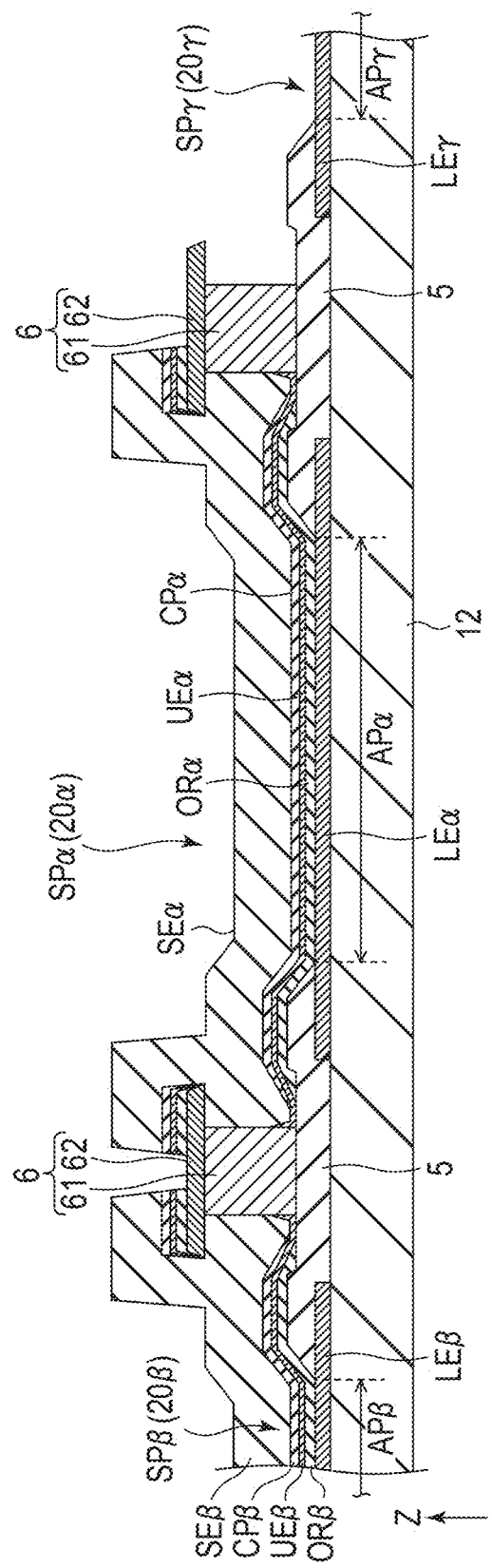
F I G. 22

METHOD OF MANUFACTURING DISPLAY DEVICE

CROSS-REFERENCE TO RELATED APPLICATIONS

This application is based upon and claims the benefit of priority from Japanese Patent Application No. 2022-029571, filed Feb. 28, 2022, the entire contents of which are incorporated herein by reference.

FIELD

Embodiments described herein relate generally to a method for manufacturing a display device.

BACKGROUND

Recently, display devices to which an organic light-emitting diode (OLED) is applied as a display element have been put into practical use. Such a display element comprises a lower electrode, an organic layer covering the lower electrode, and an upper electrode covering the organic layer.

In the process of manufacturing such display devices, various elements are formed by etching. During etching of some elements, if other elements are damaged, the reliability of the display device may be lowered.

BRIEF DESCRIPTION OF THE DRAWINGS

FIG. 1 is a diagram showing a configuration example of a display device according to an embodiment.

FIG. 8 is a schematic cross-sectional view of a part of the manufacturing process of the display device.

FIG. 9 is a schematic cross-sectional view showing a manufacturing process, which follows that of FIG. 8.

FIG. 10 is a schematic cross-sectional view showing a manufacturing process, which follows that of FIG. 9.

FIG. 16 is a schematic cross-sectional view showing the manufacturing process of forming a contact hole in the surrounding area.

FIG. 17 is a schematic cross-sectional view showing the manufacturing process for removing an insulating layer which covers a dam portion and a terminal portion in the surrounding area.

FIG. 18 is a schematic cross-sectional view showing the manufacturing process for forming a first display element.

FIG. 21 is a schematic cross-sectional view showing a manufacturing process, which follows that of FIG. 20.

FIG. 22 is a schematic cross-sectional view showing the manufacturing process for forming a second display element.

DETAILED DESCRIPTION

Figure 2:
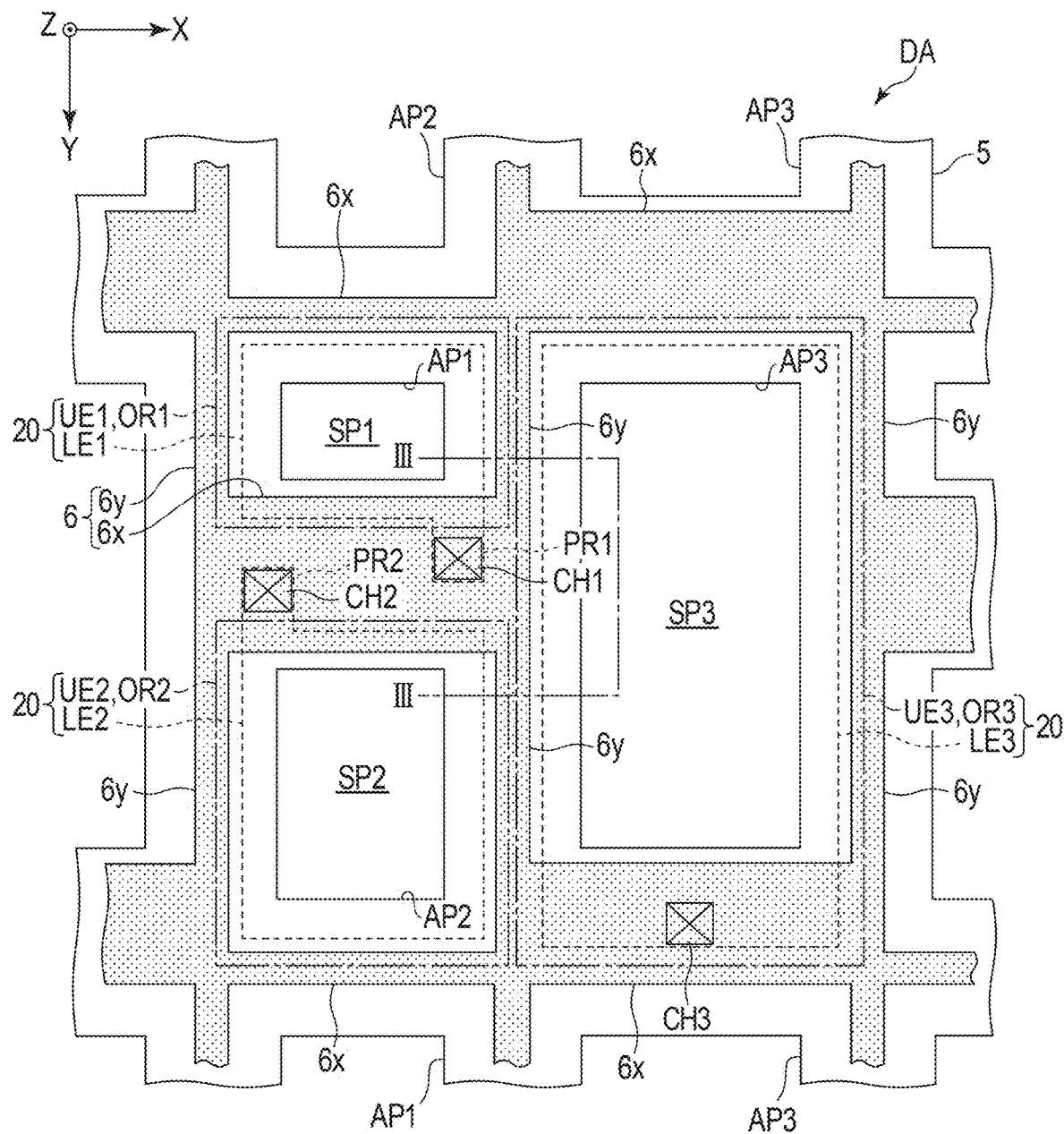
FIG. 2 is a diagram showing an example of layout of subpixels.

In general, according to one embodiment, a method of manufacturing a display device includes: forming a first lower electrode above a substrate; forming an insulating layer which covers the first lower electrode; forming a partition including a lower portion located on the insulating layer and an upper portion protruding from a side surface of the lower portion; forming, after the forming of the partition, a first pixel aperture overlapping the first lower electrode in the insulating layer; forming a first organic layer in contact with the first lower electrode via the first pixel aperture; forming a first upper electrode which covers the first organic layer; and patterning the first organic layer and the first upper electrode to form a first display element including the first lower electrode, the first organic layer and the first upper electrode.

According to another aspect of the embodiment, a method of manufacturing a display device includes: forming a lower electrode located in a display area and a power feed line located in a surrounding area on an outside of the display area above a substrate; forming an insulating layer which covers the lower electrode and the power feed line; forming a contact aperture which overlaps the power feed line in the insulating layer; forming, after the forming of the contact aperture, a partition located above the insulating layer in the display area and a conductive layer in contact with the power feed line via the contact aperture in the surrounding area; forming, after the forming of the partition and the conductive layer, a pixel aperture which overlaps the lower electrode in the insulating layer, forming an organic layer in contact with the lower electrode via the pixel aperture; and forming an upper electrode which covers the organic layer.

According to these manufacturing methods, it is possible to provide a display device with improved reliability.

An embodiments will be described with reference to the accompanying drawings.

Note that the disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction, a direction parallel to the Y-axis is referred to as a second direction, and a direction parallel to the Z-axis is referred to as a third direction. Viewing structural elements parallel to the third direction Z is referred to as plan view.

The display device of this embodiment is an organic electroluminescent display device comprising an organic light-emitting diode (OLED) as a display element, and could be mounted on televisions, personal computers, in-vehicle devices, tablets, smartphones, mobile phones and the like.

FIG. 1 is a diagram showing a configuration example of a display device DSP according to this embodiment. The display device DSP includes a display area DA which displays images and a surrounding area SA around the display area DA on an insulating substrate 10. The substrate 10 may be glass or a flexible resin film.

In this embodiment, the shape of the substrate 10 in plan view is rectangular. Note that the shape of the substrate 10 in plan view is not limited to rectangular, but may be of other shape such as a square, circle or oval.

The display area DA comprises a plurality of pixels PX arranged in a matrix along the first direction X and the second direction Y. The pixels PX each include a plurality of sub-pixels SP. For example, the pixels PX each includes a red sub-pixel SP1, a green sub-pixel SP2 and a blue sub-pixel SP3. Note that the pixels PX each may include, in addition to the subpixels SP1, SP2 and SP3 or in place of any of the subpixels SP1, SP2 and SP3, subpixels SP of some other color such as white and the like.

The subpixels SP each comprise a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to a power line PL and the capacitor 4, and the other is connected to the display element 20.

Note that the configuration of the pixel circuit 1 is not limited to that of the example shown in the figure. For example, the pixel circuit 1 may comprise more thin-film transistors and capacitors.

The display element 20 is an organic light-emitting diode (OLED) as a light-emitting device. For example, the sub-pixel SP1 comprises a display element 20 which emits light in the red wavelength range, the sub-pixel SP2 comprises a display element 20 which emits light in the green wavelength range, and the sub-pixel SP3 comprises a display element 20 which emits light in the blue wavelength range.

In the surrounding area SA, a terminal portion T is provided. The terminal portion T is connected via a flexible circuit board, for example, to a substrate of an electronic device on which the display device DSP is mounted. Video signals and drive power for displaying images are input to the display device DSP via the terminal portion T.

FIG. 2 is a diagram showing an example of layout of subpixels SP1, SP2 and SP3. In the example of FIG. 2, the sub-pixel SP1 and the sub-pixel SP2 are aligned along the second direction Y. Further, the sub-pixel SP1 and the sub-pixel SP2 are each aligned with the sub-pixel SP3 along in the first direction X.

When the sub-pixels SP1, SP2 and SP3 have such a layout, columns in each of which the sub-pixels SP1 and SP2 are arranged alternately along the second direction Y and columns in each of which the sub-pixels SP3 are arranged repeatedly along the second direction Y are formed in the display area DA. These columns are arranged alternately along the first direction X.

Note that the layout of the sub-pixels SP1, SP2 and SP3 is not limited to that of the example in FIG. 2. As another example, the sub-pixels SP1, SP2 and SP3 in each pixel PX may be arranged in order along the first direction X.

In the display area DA, a rib 5 and a partition 6 are arranged. The rib 5 includes pixel apertures AP1, AP2 and AP3 in the sub-pixels SP1, SP2 and SP3, respectively. In the example of FIG. 2, the pixel aperture AP2 is larger than the pixel aperture AP1, and the pixel aperture AP3 is larger than the pixel aperture AP2.

The partition 6 is placed at the boundary of each pair of sub-pixels SP adjacent to each other, so as to overlap the rib 5 in plan view. The partition 6 includes a plurality of first partitions 6x extending along the first direction X and a plurality of second partitions 6y extending along the second direction Y. The first partitions 6x are each disposed between each pair of pixel apertures AP1 and AP2 adjacent to each other along the second direction Y and between each pair of pixel apertures AP3 adjacent to each other along the second direction Y. The second partitions 6y are each disposed between each pair of pixel apertures AP1 and AP3 adjacent to each other along the first direction X and between each pair of pixel apertures AP2 and AP3 adjacent to each other along the first direction X.

In the example of FIG. 2, the first partitions 6x and the second partitions 6y are connected to each other. With this structure, the partition 6, as a whole, has a latticelike shape which surrounds the pixel apertures AP1, AP2 and AP3. It can as well be said that the partition 6 includes openings in the sub-pixels SP1, SP2 and SP3, respectively, as in the rib 5.

The sub-pixels SP1 each comprise a lower electrode LE1, an upper electrode UE1, and an organic layer OR1, which overlap with the respective pixel aperture AP1. The sub-pixels SP2 each comprise a lower electrode LE2, an upper electrode UE2 and an organic layer OR2, which overlap the respective pixel aperture AP2. The sub-pixels SP3 each comprise a lower electrode LE3, an upper electrode UE3 and an organic layer OR3, which overlap the respective pixel aperture AP3. In the example of FIG. 2, outlines of the upper electrode UE1 and the organic layer OR1 match each other, the outlines of the upper electrode UE2 and the organic layer OR2 match each other, and outlines of the upper electrode UE3 and the organic layer OR3 match each other.

The lower electrode LE1, the upper electrode UE1 and the organic layer OR1 constitute the display element 20 of the sub-pixel SP1. The lower electrode LE2, the upper electrode UE2 and the organic layer OR2 constitute the display element 20 of the sub-pixel SP2. The lower electrode LE3, the upper electrode UE3 and the organic layer OR3 constitute the display element 20 of the sub-pixel SP3.

The lower electrode LE1 is connected to the pixel circuit 1 (see FIG. 1) of the sub-pixel SP1 via a contact hole CH1. The lower electrode LE2 is connected to the pixel circuit 1 of the sub-pixel SP2 via a contact hole CH2. The lower electrode LE3 is connected to the pixel circuit 1 of the sub-pixel SP3 via a contact hole CH3.

In the example of FIG. 2, the contact holes CH1 and CH2 entirely overlap the respective first partition 6x between the pixel apertures AP1 and AP2 adjacent to each other along the second direction Y. The contact hole CH3 entirely overlaps the respective first partition 6x between each pair of pixel apertures AP3 adjacent to each other along the second direction Y. As another example, at least a part of the contact holes CH1, CH2 and CH3 may not overlap the respective first partition 6x.

In the example of FIG. 2, the lower electrodes LE1 and LE2 includes protrusions PR1 and PR2, respectively. The protrusions PR1 protrudes out from the main body of the lower electrode LE1 (the portion overlapping the pixel aperture AP1) toward the contact hole CH1. The protrusions PR2 protrudes out from the main body of the lower electrode LE2 (the portion overlapping the pixel aperture AP2) toward the contact hole CH2. The contact holes CH1 and CH2 overlap the protrusions PR1 and PR2, respectively.

Figure 3:
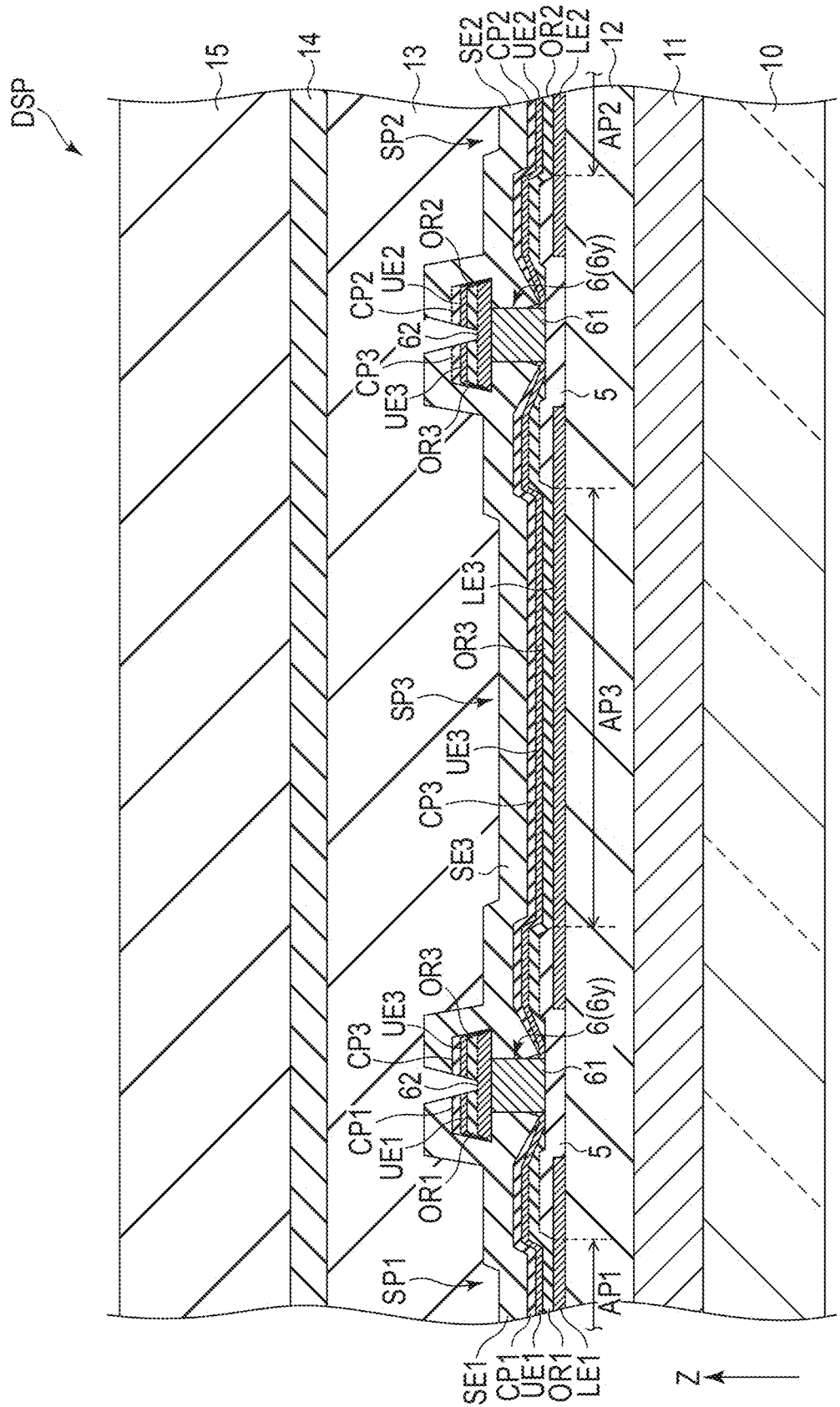
FIG. 3 is a schematic cross-sectional view of the display device taken along line III-III in FIG. 2.

FIG. 3 is a cross-sectional view schematically showing the display device DSP taken along line III-III in FIG. 2. On the substrate 10 described above, a circuit layer 11 is disposed. The circuit layer 11 includes various circuits and wiring lines such as the pixel circuit 1, the scanning line GL, the signal line SL and the power line PL shown in FIG. 1. The circuit layer 11 is covered by an organic insulating layer 12. The organic insulating layer 12 functions as a planarization film to planarize unevenness caused by the circuit layer 11. Although not shown in the cross section of FIG. 3, the contact holes CH1, CH2 and CH3 described above are provided in the organic insulating layer 12.

The lower electrodes LE1, LE2 and LE3 are disposed on the organic insulating layer 12. The rib 5 is disposed on the organic insulating layer 12 and the lower electrodes LE1, LE2 and LE3. End portions of the lower electrodes LE1, LE2 and LE3 are covered by the rib 5.

The partition 6 includes a lower portion 61 disposed on the rib 5 and an upper portion 62 disposed on the lower portion 61. The upper portion 62 has a width greater than that of the lower portion 61. With this configuration, in FIG. 3, both the end portions of the upper portion 62 protrude beyond respective side surfaces of the lower portion 61. Such a shape of the partition 6 can as well be referred to as an overhang shape.

The organic layer OR1 covers the lower electrode LE1 via the pixel aperture AP1. The upper electrode UE1 covers the organic layer OR1 and opposes the lower electrode LE1. The organic layer OR2 covers the lower electrode LE2 via the pixel aperture AP2. The upper electrode UE2 covers the organic layer OR2 and opposes the lower electrode LE2. The organic layer OR3 covers the lower electrode LE3 via the pixel aperture AP3. The upper electrode UE3 covers the organic layer OR3 and opposes the lower electrode LE3.

In the example of FIG. 3, a cap layer CP1 is disposed on the organic layer OR1, a cap layer CP2 is disposed on the organic layer OR2, and a cap layer CP3 is disposed on the organic layer OR3. The cap layers CP1, CP2 and CP3 adjust the optical properties of the light emitted by each of the organic layers OR1, OR2 and OR3.

Parts of the organic layer OR1, the upper electrode UE1 and the cap layer CP1 are located above the upper portion 62. The parts are separated from other parts of the organic layer OR1, the upper electrode UE1 and the cap layer CP1. Similarly, parts of the organic layer OR2, the upper electrode UE2 and the cap layer CP2 are located above the upper portion 62, and the parts are separated from other portions of the organic layer OR2, the upper electrode UE2 and the cap layer CP2. Further, parts of the organic layer OR3, the upper electrode UE3 and the cap layer CP3 are located above the upper portion 62, and the parts are separated from other portions of the organic layer OR3, the upper electrode UE3 and the cap layer CP3.

In the sub-pixels SP1, SP2 and SP3, sealing layers SE1, SE2 and SE3 are disposed, respectively. The sealing layer SE1 continuously covers the cap layer CP1 and the partition 6. The sealing layer SE2 continuously covers the cap layer CP2 and the partition 6. The sealing layer SE3 continuously covers the cap layer CP3 and the partition 6.

In the example of FIG. 3, the organic layer OR1, the upper electrode UE1, the cap layer CP1 and the sealing layer SE1 on the partition 6 between the sub-pixels SP1 and SP3 are spaced apart from the organic layer OR3, the upper electrode UE3, the cap layer CP3 and the sealing layer SE3 on this partition 6, respectively. Further, the organic layer OR2, the upper electrode UE2, the cap layer CP2 and the sealing layer SE2 on the partition 6 between the sub-pixels SP2 and SP3 are spaced apart from the organic layer OR3, the upper electrode UE3, the cap layer CP3 and the sealing layer SE3 on this partition 6, respectively.

The sealing layers SE1, SE2 and SE3 are covered by a resin layer 13. The resin layer 13 is covered by a sealing layer 14. Further, the sealing layer 14 is covered by a resin layer 15.

The organic insulating layer 12 and the resin layers 13 and 15 are formed of organic materials.

The rib 5 and the sealing layers 14, SE1, SE2 and SE3 are formed, for example, of an inorganic material such as silicon nitride (SiNx). The rib 5 may be formed as a single layer of either one of silicon oxide (SiOx), silicon oxynitride (SiON) and aluminum oxide ($Al_2O_3$). The rib 5 may as well be formed as a stacked multilayer of any combination of at least two of a silicon nitride layer, a silicon oxide layer, a silicon oxynitride layer and an aluminum oxide layer.

The upper electrodes UE1, UE2 and UE3 are formed, for example, of a metal material such as an alloy of magnesium and silver (MgAg). When the potential of the lower electrodes LE1, LE2 and LE3 is relatively higher than that of the upper electrodes UE1, UE2 and UE3, the lower electrodes LE1, LE2 and LE3 correspond to anodes, respectively, and the upper electrodes UE1, UE2 and UE3 correspond to cathodes, respectively. When the potential of the upper electrodes UE1, UE2 and UE3 is relatively higher than that of the lower electrodes LE1, LE2 and LE3, the upper electrodes UE1, UE2 and UE3 correspond to the anodes and the lower electrodes LE1, LE2 and LE3 correspond to the cathode.

The organic layers OR1, OR2 and OR3 each include a pair of functional layers and a light-emitting layer disposed between these functional layers. For example, the organic layers OR1, OR2 and OR3 each have a structure in which a hole injection layer, a hole transport layer, an electron blocking layer, an emission layer, a hole blocking layer, an electron transport layer and an electron injection layer are stacked in order.

The cap layers CP1, CP2 and CP3 are formed, for example, by a multilayer of a plurality of transparent thin films. The multilayer may include, as the plurality of thin films, thin films formed of inorganic materials and thin films formed of organic materials. These thin films have refractive indices different from each other. The materials of the thin films which constitute the multilayer are different from the material of the upper electrodes UE1, UE2 and UE3, and also from the material of the sealing layers SE1, SE2 and SE3. Note that the cap layers CP1, CP2 and CP3 may be omitted.

To the partition 6, a common voltage is supplied. The common voltage is supplied to each of the upper electrodes UE1, UE2 and UE3, which are in contact with the side surface of the lower portion 61. To the lower electrodes LE1, LE2 and LE3, respective pixel voltages are supplied via the respective pixel circuits 1 of the sub-pixels SP1, SP2 and SP3.

When a potential difference is created between the lower electrode LE1 and the upper electrode UE1, the light-emitting layer of the organic layer OR1 emits light in the red wavelength range. When a potential difference is created between the lower electrode LE2 and the upper electrode UE2, the light-emitting layer of the organic layer OR2 emits light in the green wavelength range. When a potential difference is created between the lower electrode LE3 and the upper electrode UE3, the light-emitting layer of the organic layer OR3 emits light in the blue wavelength range.

Figure 4:
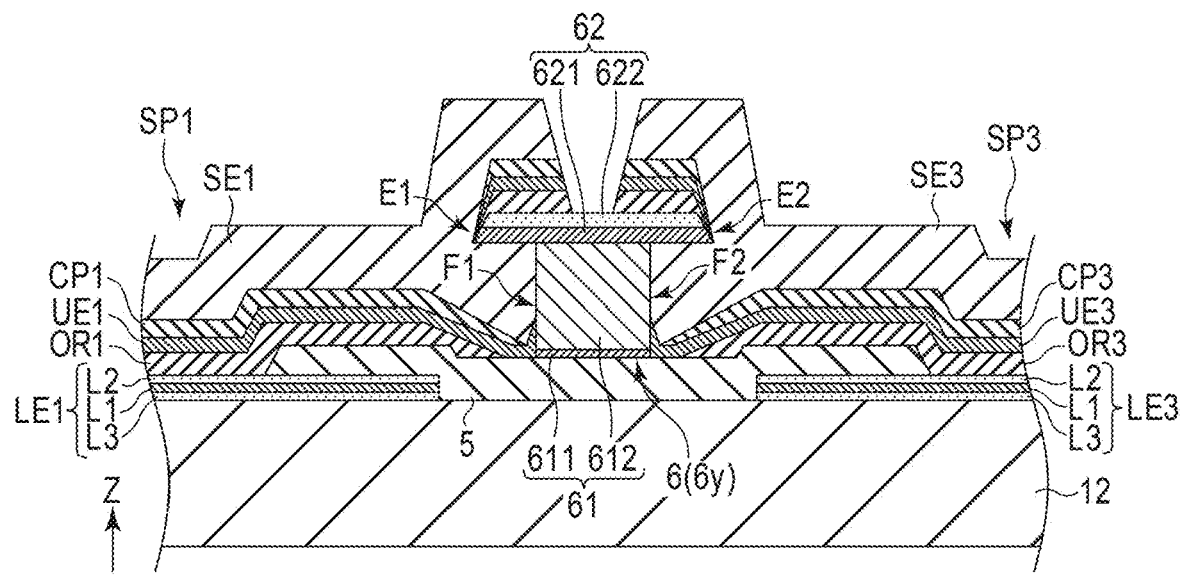
FIG. 4 is an enlarged cross sectional view showing a partition and its vicinity.

FIG. 4 is an enlarged cross-sectional view schematically showing the partition 6 and its vicinity located at the boundary between the sub-pixels SP1 and SP2. In this drawing, the substrate 10, the circuit layer 11, the resin layer 13, the sealing layer 14 and the resin layer 15 are omitted.

The lower portion 61 of the partition 6 includes a side surface F1 and a side surface F2. The upper portion 62 of the partition 6 includes an end portion E1 protruding from the side surface F1 and an end portion E2 protruding from the side surface F2. The upper electrodes UE1 and UE3 are in contact with the side surfaces F1 and F2, respectively.

In the example of FIG. 4, the lower portion 61 includes a first metal layer 611 disposed on the rib 5 and a second metal layer 612 disposed on the first metal layer 611. Further, the upper portion 62 incudes a first thin film 621 disposed on the second metal layer 612 and a second thin film 622 disposed on the first thin film 621.

The first metal layer 611 is formed, for example, of molybdenum (Mo). The second metal layer 612 is formed, for example, of aluminum (Al) so as to be thicker than the first metal layer 611. The second metal layer 612 may be formed of an aluminum alloy or may have a multilayer structure of aluminum and aluminum alloys.

The first thin film 621 is formed, for example, of titanium (Ti). The first thin film 621 may be formed of an inorganic material such as silicon oxide. The second thin film 622 is formed, for example, of a transparent conductive oxide such as indium tin oxide (ITO), indium zinc oxide (IZO) or indium gallium zinc oxide (IGZO). The upper portion 62 may have a single layer structure of titanium, silicon oxide or the like.

In the example of FIG. 4, the lower electrode LE1 includes a silver layer L1 formed of silver (Ag), a first conductive oxide layer L2 covering an upper surface of the silver layer L1 and a second conductive oxide layer L3 covering a lower surface of the silver layer L1. The conductive oxide layers L2 and L3 can be formed of ITO, IZO or IGZO, for example. The lower electrodes LE2 and LE3 as well have a structure similar to that of the lower electrode LE1. For example, the first conductive oxide layer L2 is thinner than the silver layer L1 and the second conductive oxide layer L3. To give a specific example, the silver layer L1 and the second conductive oxide layer L3 have a thickness of about 100 nm, and the first conductive oxide layer L2 has a thickness of about 10 nm.

Figure 5:
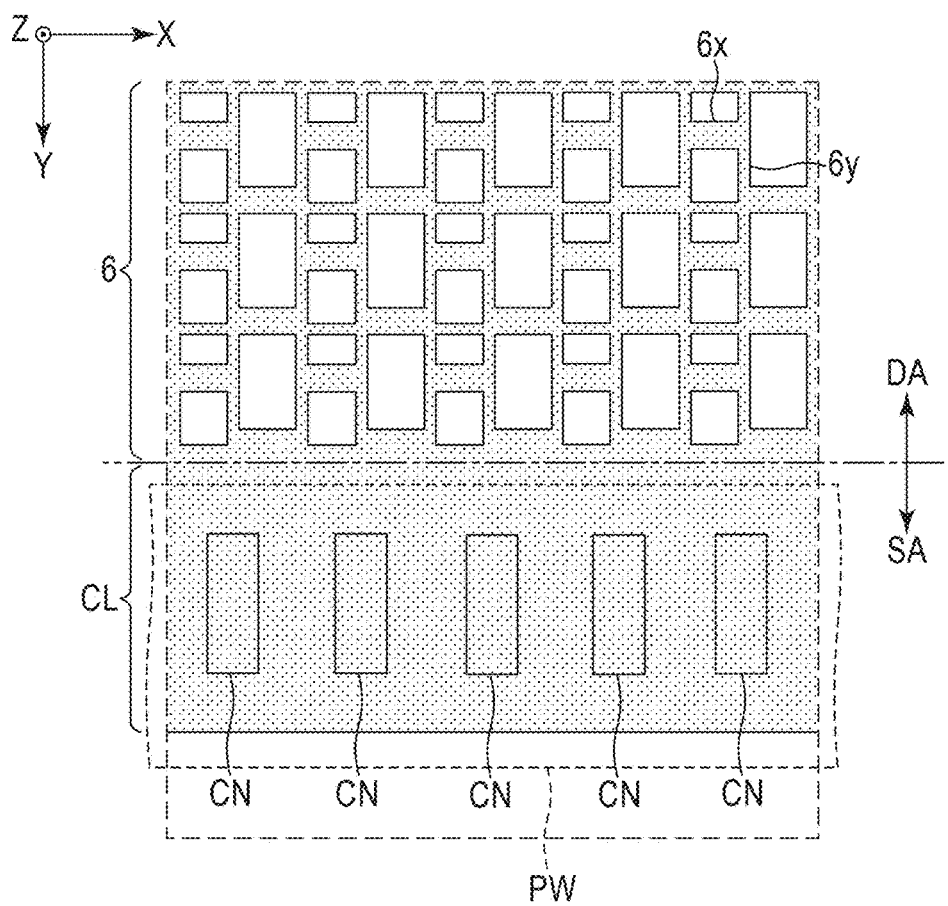
FIG. 5 is a schematic plan view showing the vicinity of a boundary between a display area and its surrounding area.

FIG. 5 is a schematic plan view of the vicinity of the boundary between the display area DA and the surrounding area SA. In the display region DA, the partition 6 (the first partition 6x and the second partition 6y) is disposed. In the surrounding area SA, a conductive layer CL connected to the partition 6 is disposed. The conductive layer CL and the partition 6 are formed to be integrated with each other as one body by the same manufacturing process and of the same material.

In the surrounding area SA, a power feed line PW is disposed. The conductive layer CL is connected to the power feed line PW via a plurality of contact portions CN. For example, the contact portions CN are arranged to surround the display area DA.

In the example of FIG. 5, the display area DA and the surrounding area SA are aligned along the second direction Y. In such areas, the contact portions CN each have a shape elongated along the second direction Y and are aligned along the first direction X. For example, in a region where the display area DA and the surrounding area SA are aligned along the first direction X, the contact portions CN each have a shape elongated along the first direction X and are aligned along the second direction Y.

Figure 6:
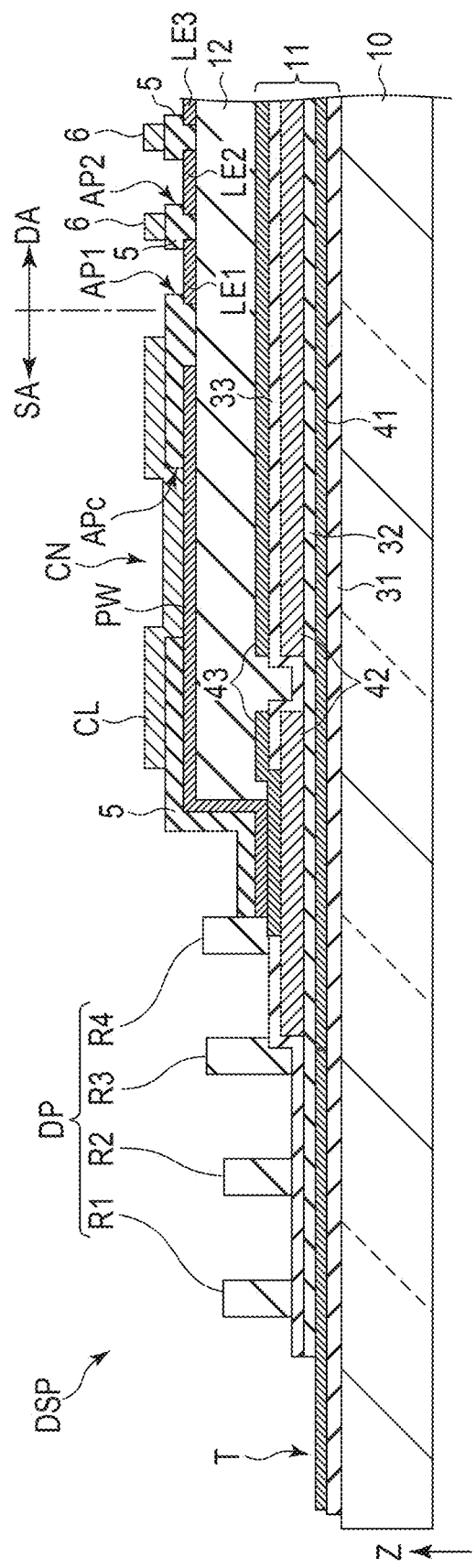
FIG. 6 is a schematic cross-sectional view showing the display area and the surrounding area.

FIG. 6 is a schematic cross-sectional view of the display area DA and the surrounding area SA. In this figure, the organic layers OR1, OR2 and OR3, the upper electrodes UE1, UE2 and UE3, the cap layers CP1, CP2 and CP3, the sealing layers SE1, SE2 and SE3, the resin layer 13, the sealing layer 14 and the resin layer 15 are omitted.

The circuit layer 11 comprises insulating layers 31, 32 and 33 and metal layers 41, 42 and 43. The insulating layer 31 covers the substrate 10. The metal layer 41 is disposed on the insulating layer 31 and is covered by the insulating layer 32. The metal layer 42 is disposed on the insulating layer 32 and is covered by the insulating layer 33. The metal layer 43 is disposed on the insulating layer 33 and is covered by the organic insulating layer 12.

The metal layers 41, 42 and 43, together with a semiconductor layer and the like not shown in the figure, constitute a gate drive circuit which supplies scanning signals to the scanning line GL and a selector circuit which supplies video signals to the signal line SL. In the example of FIG. 6, the terminal portion T is formed from the metal layer 41. For example, the metal layer 41 has a multilayer structure of titanium, aluminum and titanium. The terminal portion T may be formed from the metal layer 42 or the metal layer 43, or from a conductive layer other than the metal layer 41, 42 or 43.

The rib 5 is disposed in the surrounding area SA as well. The conductive layer CL is disposed on the rib 5. The conductive layer CL includes a lower portion 61 and an upper portion 62, as in the case of the partition 6 shown in FIGS. 3 and 4.

The power feed line PW is disposed between the organic insulating layer 12 and the rib 5. The power feed line PW is connected to a part of the metal layer 43, for example. To the power feed line PW, a common voltage is applied. The power feed line PW is formed by the same manufacturing process as that of the lower electrodes LE1, LE2 and LE3, for example, and includes the silver layer L1 and the conductive oxide layers L2 and L3 shown in FIG. 4. The rib 5 includes a contact aperture APc in the contact portion CN. The conductive layer CL is connected to the power feed line PW via the contact aperture APc.

In the surrounding area SA, a dam portion DP is disposed between the terminal portion T and the conductive layer CL. The dam portion DP includes a plurality of protrusions R1, R2, R3 and R4. The protrusions R1, R2, R3 and R4 are formed by the same process from the same material as that of the organic insulating layer 12, for example. In the example of FIG. 6, the rib 5 is not arranged in the dam portion DP or the terminal section T, and the protrusions R1, R2, R3 and R4 are all arranged on the insulating layer 33.

For example, the protrusions R1, R2, R3 and R4 each have a frame-shape, which surrounds the display area DA and the conductive layer CL in plan view. The resin layer 13 shown in FIG. 3 is formed, for example, by an ink-jet method. The dam portion DP suppresses the spreading of the resin layer 13 before curing. Note that the number of protrusions of the dam portion DP is not limited to four.

Next, a method of manufacturing the display device DSP will be described.

Figure 7:
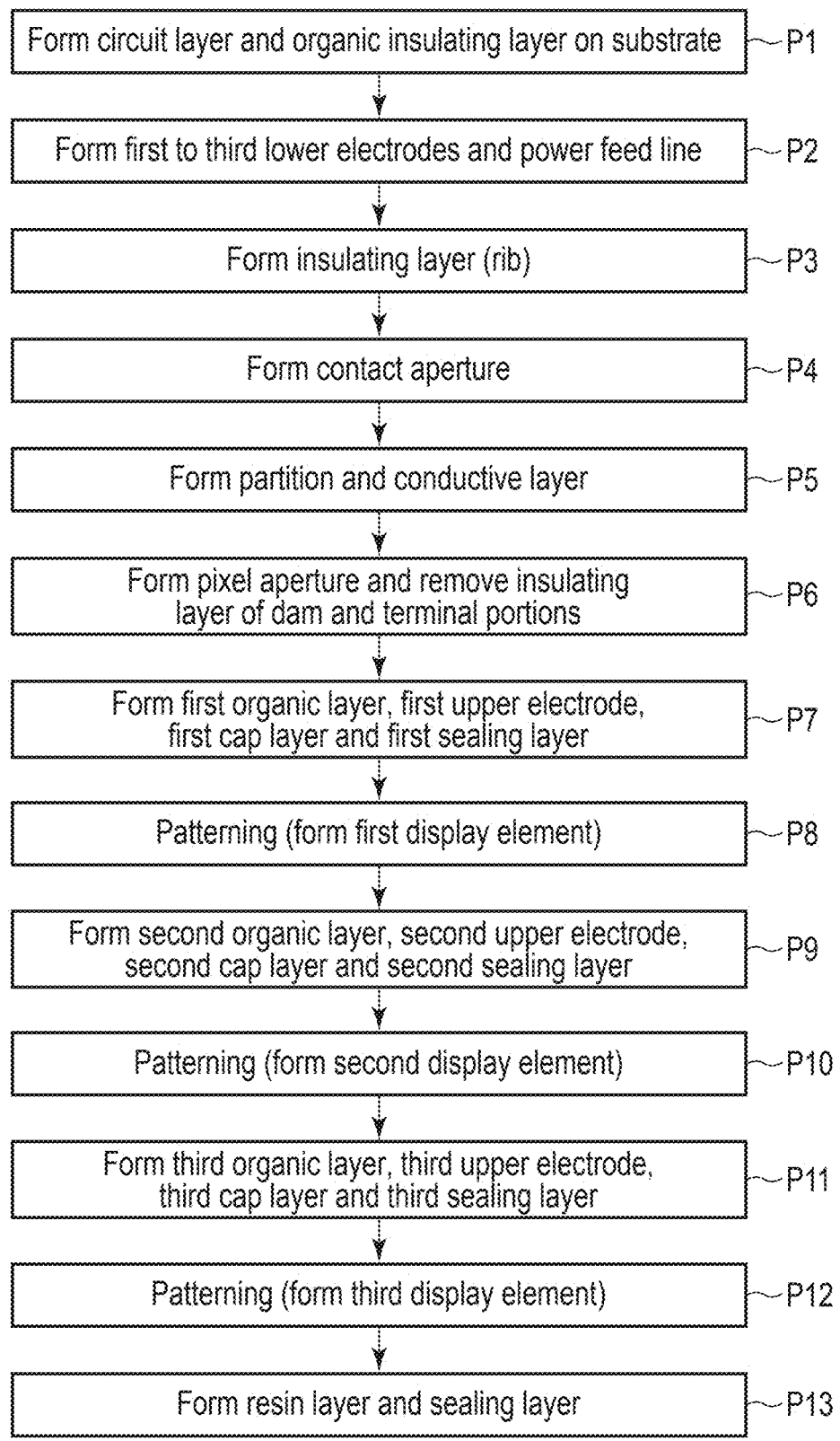
FIG. 7 is a flowchart showing an example of a method of manufacturing a display device.

FIG. 7 is a flowchart showing an example of the method of manufacturing the display device DSP. FIGS. 8 to 23 are schematic cross-sectional views each showing a respective part of the manufacturing process of the display device DSP. In these figures, FIGS. 8 to 15 and FIGS. 18 to 23 show a part of the display area DA, and FIGS. 16 to 19 mainly show a part of the surrounding area SA.

In this embodiment, the display elements 20 of the sub-pixels SP1, SP2 and SP3 are formed by separate processes, respectively. Although the order of formation of the display elements 20 of the sub-pixels SP1, SP2 and SP3 is not particularly limited, but for convenience of explanation, the sub-pixel in which the display element 20 is formed first is referred to as the first sub-pixel SPα, the sub-pixel in which the display element 20 is formed second is referred to as the second sub-pixel SPβ, and the sub-pixel in which the display element 20 is formed third is referred to as the third sub-pixel SPγ.

Further, the lower electrode, the organic layer, the upper electrode, the cap layer, the sealing layer, the pixel aperture and the display element of the first sub-pixel SPα are referred to as a first lower electrode LEα, a first organic layer ORα, a first upper electrode UEα, a first cap layer CPα, a first sealing layer SEα, a first pixel aperture APα and a first display element 20α, respectively. The lower electrode, the organic layer, the upper electrode, the cap layer, the sealing layer, the pixel aperture and the display element of the second sub-pixel SPβ are referred to as a second lower electrode LEβ, a second organic layer ORβ, a second upper electrode UEβ, a second cap layer CPβ, a second sealing layer SEβ, a second pixel aperture APB and a second display element 20B, respectively. The lower electrode, the organic layer, the upper electrode, the cap layer, the sealing layer, the pixel aperture and the display element of the third sub-pixel SPγ are referred to as a third lower electrode LEγ, a third organic layer ORγ, a third upper electrode UEγ, a third cap layer CPγ, a third sealing layer SEγ, a third pixel aperture APγ and a third display element 20γ, respectively.

In the manufacturing of the display device DSP, first, the circuit layer 11 and the organic insulating layer 12 are formed on the substrate 10 (process P1 in FIG. 7). At this time, the terminal portion T and the protrusions R1, R2, R3 and R4 are formed as well.

After the process P1, as shown in FIG. 8, the first lower electrode LEα and the second lower electrode LEβ are formed on the organic insulating layer 12 (above the substrate 10) (process P2 in FIG. 7). At this time, the third lower electrode LEγ and the power feed line PW are formed as well.

After the process P2, as shown in FIG. 9, the insulating layer 5a, which gives rise to the base of the rib 5, is formed (process P3 in FIG. 7). The insulating layer 5a is formed, for example, of an inorganic material such as silicon nitride, and covers the first lower electrode LEα, the second lower electrode LEβ, the third lower electrode LEγ and the power feed line PW.

After the process P3, as shown in FIG. 16, the contact aperture APc is formed in the surrounding area SA (process P4 in FIG. 7). In the formation of the contact aperture APc, a resist RG1 is placed on the insulating layer 5a. Further, the portion of the resist RG1, which opposes the contact aperture APc, is removed. By carrying out dry etching using the resist RG1 as a mask, the contact aperture APc is formed in the insulating layer 5a. After the dry etching, the resist RG1 is removed.

In the process P4, the entire display area DA, the dam portion DP and the terminal portion T are covered by the insulating layer 5a and the resist RG1. Therefore, even after the process P4, the lower electrodes LEα, LEβ and LEγ, the protrusions R1, R2, R3 and R4 and the terminal portion T are not exposed from the insulating layer 5a.

After the process P4, the partition 6 and the conductive layer CL are formed (process P5 in FIG. 7). More specifically, as shown in FIG. 10, first, the first metal layer 611a is formed on the insulating layer 5a, the second metal layer 612a is formed on the first metal layer 611a, the first thin film 621a is formed on the second metal layer 612a, and the second thin film 622a is formed on the first thin film 621a.

Figure 11:
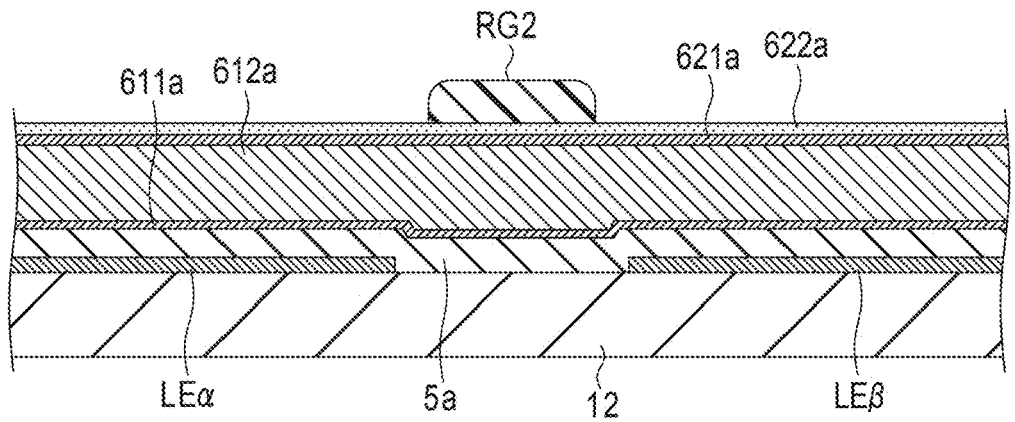
FIG. 11 is a schematic cross-sectional view showing a manufacturing process, which follows that of FIG. 10.
Figure 12:
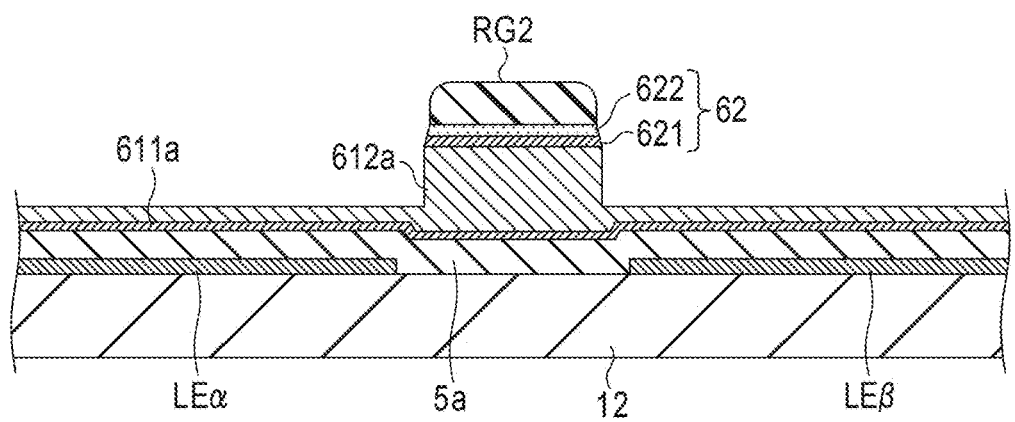
FIG. 12 is a schematic cross-sectional view showing a manufacturing process, which follows that of FIG. 11.

Next, as shown in FIG. 11, on the second thin film 622a, a resist RG2 is formed to correspond to the shape of the partition 6 and the conductive layer CL. Further, by etching using the resist RG2 as a mask, the portions of the second thin film 622a, the first thin film 621a and the second metal layer 612a, which are exposed from the resist RG2 are removed. In this manner, the upper portion 62 including the first thin film 621 and the second thin film 622 are formed as shown in FIG. 12. In the example of FIG. 12, a part of the portion of the second metal layer 612a, which is exposed from the resist RG2 remains. For example, the etching for the second thin film 622a is a wet etching, whereas the etching for the first thin film 621a and the second metal layer 612a is an anisotropic dry etching.

Figure 13:
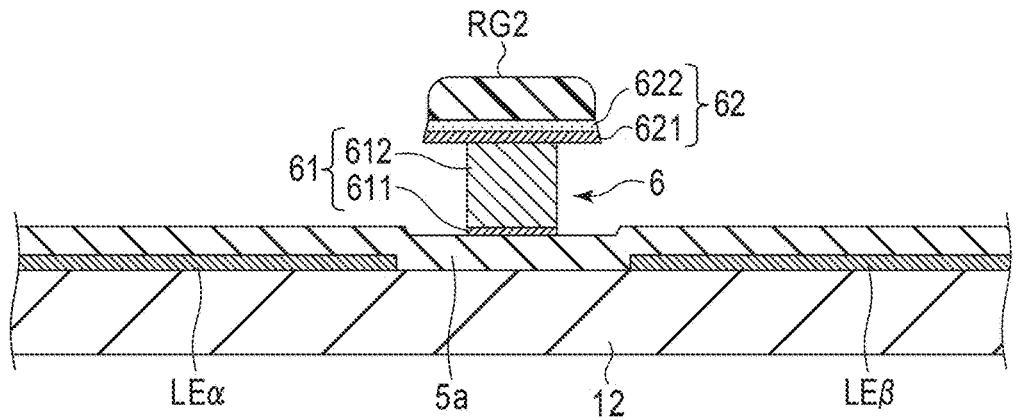
FIG. 13 is a schematic cross-sectional view showing a manufacturing process, which follows that of FIG. 12.

Subsequently, an isotropic wet etching is carried out. For the wet etching, an etchant containing phosphoric acid, nitric acid and acetic acid, for example is used. As shown in FIG. 13, by the wet etching, the portions of the second metal layer 612a and the first metal layer 611a, which are exposed from the resist RG2 are removed to form the lower portion 61 including the second metal layer 612 and the first metal layer 611. In the wet etching, side surfaces of the second metal layer 612 and the first metal layer 611 are eroded as well. As a result, the width of the lower portion 61 becomes less than the width of the upper portion 62, and thus the overhang-like partition 6 and conductive layer CL are obtained. The conductive layer CL is brought into contact with the power feed line PW via the contact aperture APc formed in the process P4. After the wet etching, the resist RG2 is removed.

Figure 14:
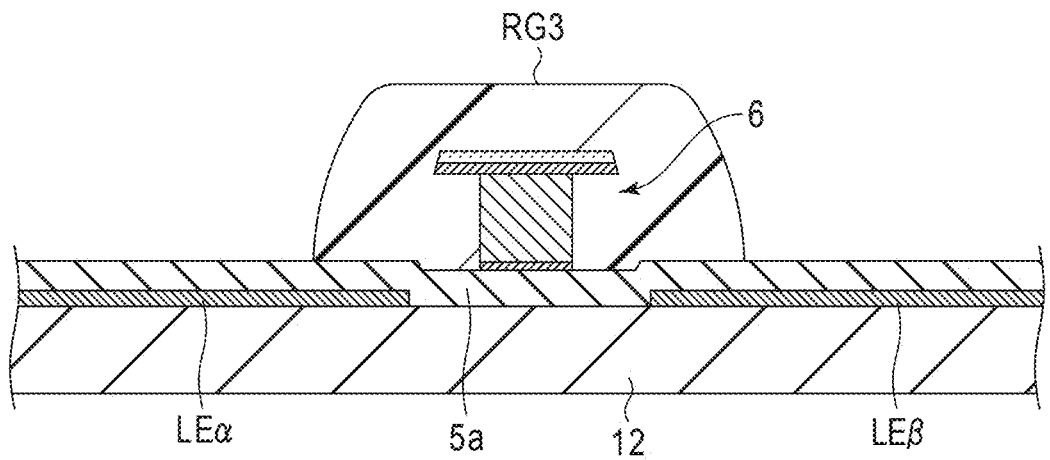
FIG. 14 is a schematic cross-sectional view showing a manufacturing process, which follows that of FIG. 13.
Figure 15:
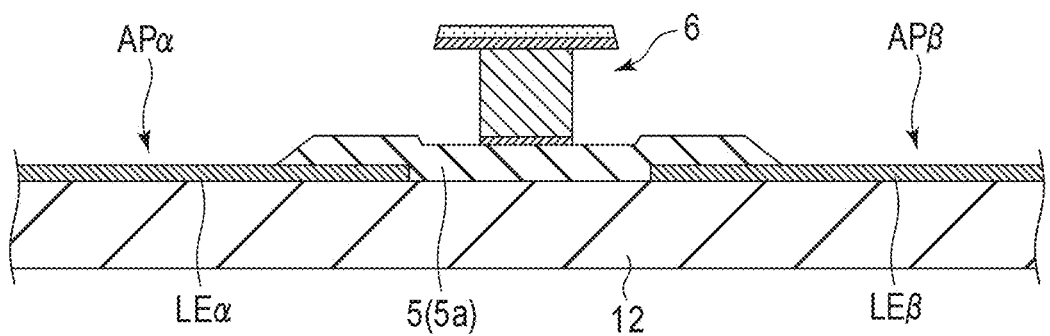
FIG. 15 is a schematic cross-sectional view showing a manufacturing process, which follows that of FIG. 14.

After the formation of the partition 6 and the conductive layer CL, the pixel apertures APα, APβ and APγ are formed (process P6 in FIG. 7). More specifically, as shown in FIG. 14, a resist RG3 is formed to cover the partition 6 and the insulating layer 5a in its vicinity. By dry-etching using the resist RG3 as a mask, the portion of the insulating layer 5a exposed from the resist RG3 is removed. In other words, as shown in FIG. 15, the first pixel aperture APα overlapping the first lower electrode LEα and the second pixel aperture APB overlapping the second lower electrode LEβ are formed. Although not shown in the cross-section in FIG. 15, the third pixel aperture APγ overlapping the third lower electrode LEγ is formed in a similar manner. Thus, the rib 5 of the shape shown in FIGS. 2 to 4 is formed.

In the process P6, the portions of the insulating layer 5a, which are located in the dam portion DP and the terminal portion T are removed as well. That is, as shown in FIG. 17, the resist RG3 covers the conductive layer CL and the insulating layer 5a in its vicinity, but does not cover the dam portion DP and the terminal portion T. With this configuration, by the dry-etching carried out when forming the pixel apertures APα, APB and APγ, the insulating layer 5a covering the dam portion DP (including the protrusions R1, R2, R3 and R4) and the terminal portions T are removed.

After the process P6, as shown in FIG. 18, the first organic layer ORα in contact with the first lower electrode LEα via the first pixel aperture APα, the first upper electrode UEα covering the first organic layer ORα, the first cap layer CPα covering the first upper electrode UEα and the first sealing layer SEα covering the first cap layer CPα are formed in order by vapor deposition (process P7 of FIG. 7). The first organic layer ORα, the first upper electrode UEα, the first cap layer CPα and the first sealing layer SEα are formed at least for the entire display area DA, and are located not only in the first sub-pixel SPa but also in the second sub-pixel SPB and the third sub-pixel SPγ.

Figure 19:
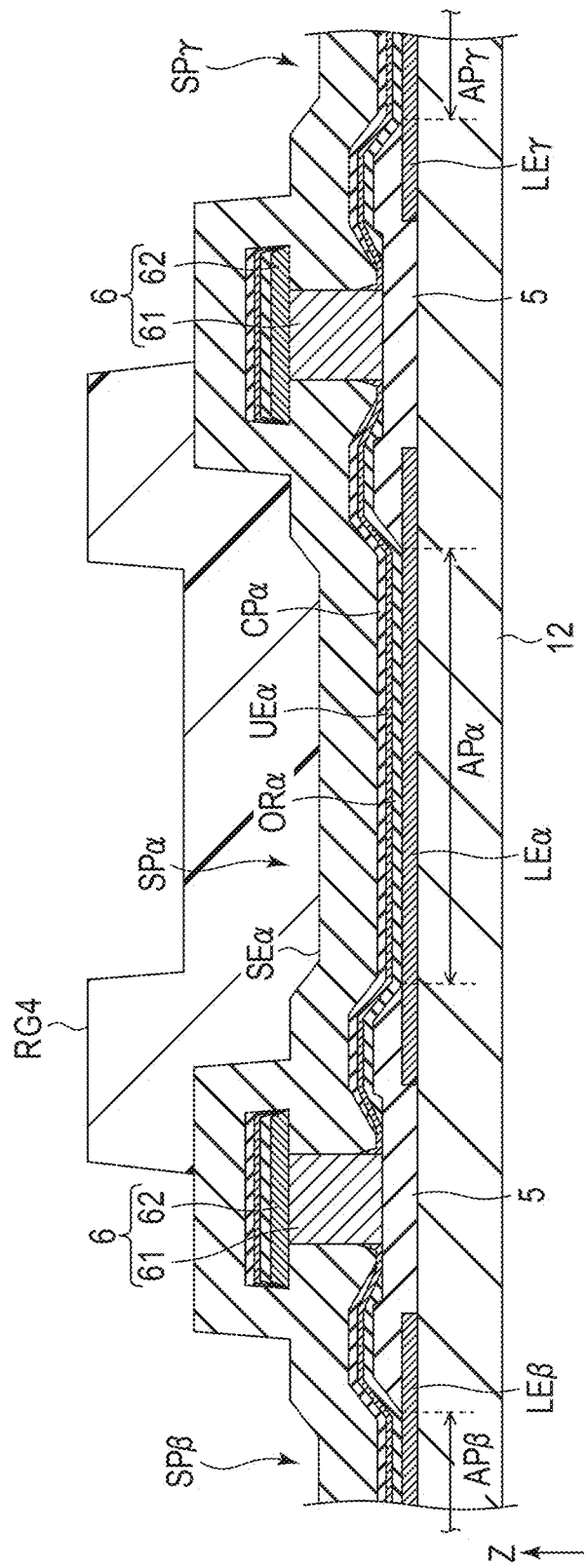
FIG. 19 is a schematic cross-sectional view showing a manufacturing process, which follows that of FIG. 18.

After the process P7, the first organic layer ORα, the first upper electrode UEα, the first cap layer CPα and the first sealing layer SEα are patterned (process P8 in FIG. 7). More specifically, first, as shown in FIG. 19, a resist RG4 is disposed on the first sealing layer SEα. The resist RG4 is located directly above the first lower electrode LEα. The resist RG4 is located directly above the portion of the partition 6 between the sub-pixels SPa and SPB, which is closer to the first sub-pixel SPa, and the portion of the partition 6 between the sub-pixels SPa and SPγ, which is closer to the first sub-pixel SPa.

Figure 20:
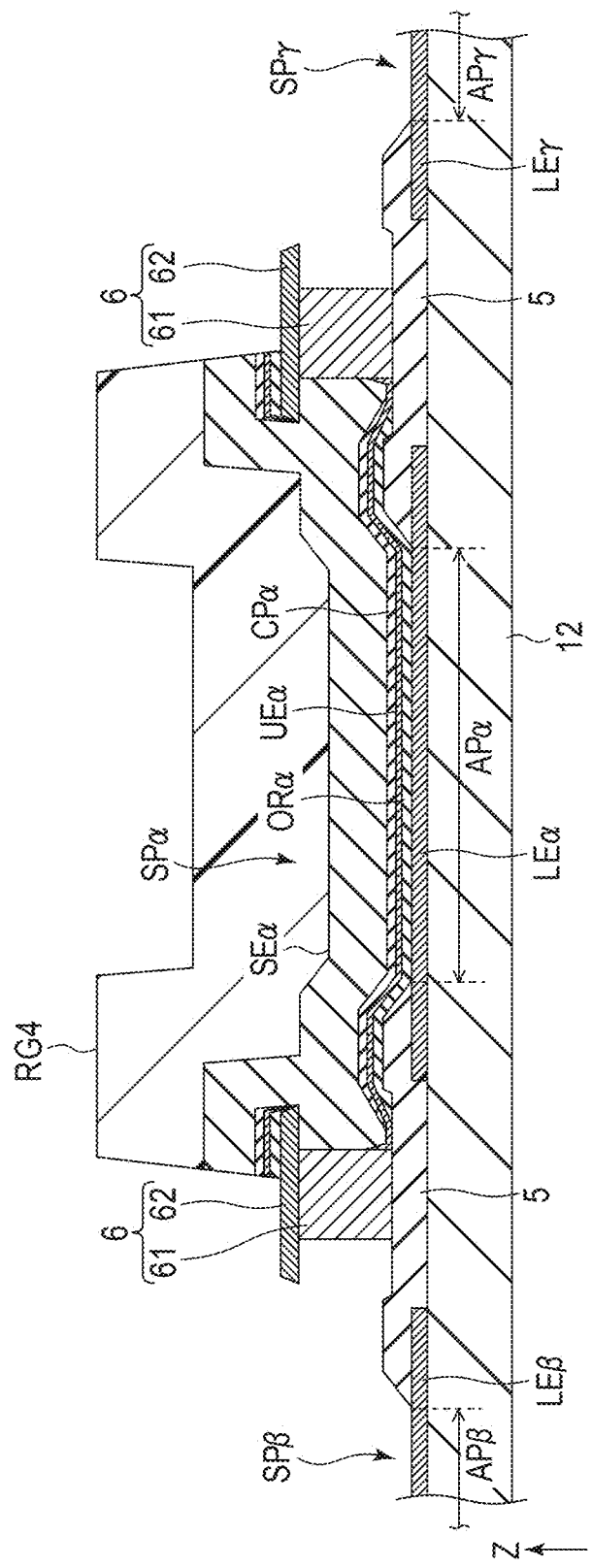
FIG. 20 is a schematic cross-sectional view showing a manufacturing process, which follows that of FIG. 19.

Next, as shown in FIG. 20, by etching using the resist RG4 as a mask, the portions of the first organic layer ORα, the first upper electrode UEα, the first cap layer CPα and the first sealing layer SEα, which are exposed from the resist RG4, are removed. After that, as shown in FIG. 21, the resist RG4 is removed, and thus the first display element 20α including the first organic layer ORα, the first upper electrode UEα, the first cap layer CPα and the first sealing layer SEα is completed.

After the process P8, the second organic layer ORB in contact with the second lower electrode LEβ via the second pixel aperture APB, the second upper electrode UEβ covering the second organic layer ORβ, the second cap layer CPβ covering the second upper electrode UEβ and the second sealing layer SEβ covering the second cap layer CPβ are formed in order by vapor deposition (process P9 of FIG. 7). Further, by a patterning process similar to the process P8, the second display element 20B including the second organic layer ORβ, the second upper electrode UEβ, the second cap layer CPβ and the second sealing layer SEβ is formed in the second sub-pixel SPB as shown in FIG. 22 (process P10 of FIG. 7).

Figure 23:
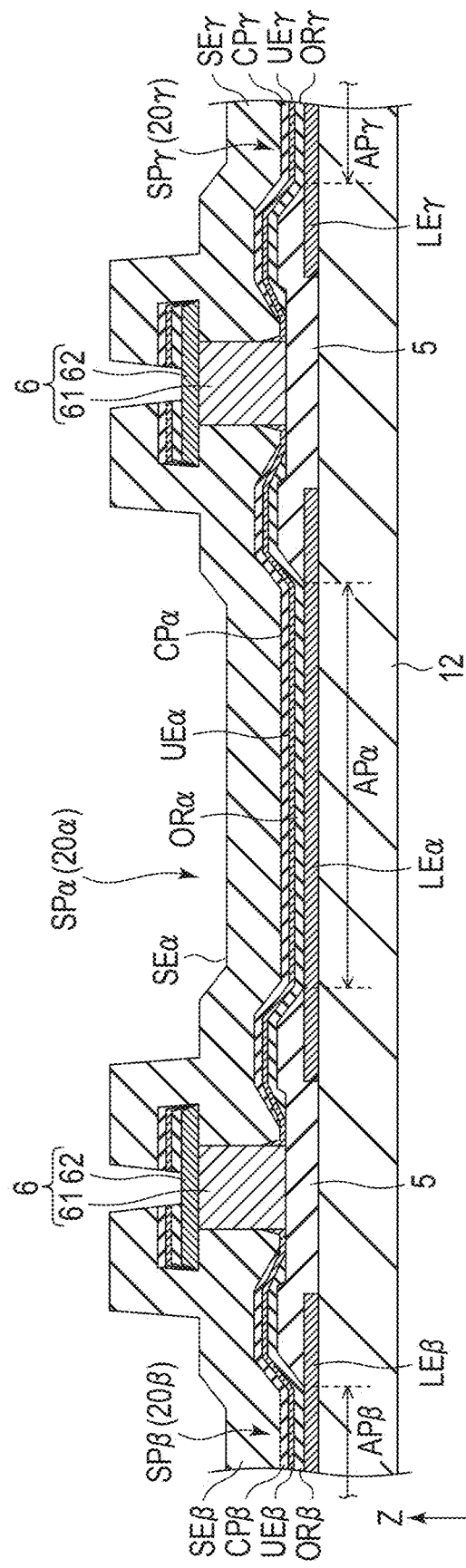
FIG. 23 is a schematic cross-sectional view showing the manufacturing process for forming a third display element.

After the process P10, the third organic layer ORγ in contact with the third lower electrode LEγ via the third pixel aperture APγ, the third upper electrode UEγ covering the third organic layer ORγ, the third cap layer CPγ covering the third upper electrode UEγ and the third sealing layer SEγ covering the third cap layer CPγ are formed in order by vapor deposition (process P11 of FIG. 7). Further, by a patterning process similar to the process P8, the third display element 20γ including the third organic layer ORγ, the third upper electrode UEγ, the third cap layer CPγ and the third sealing layer SEγ is formed in the third sub-pixel SPγ as shown in FIG. 23 (process P12 of FIG. 7).

After the display elements 20α, 20β and 20γ are formed in the above-described way, the resin layer 13, the sealing layer 14 and the resin layer 15 shown in FIG. 3 are formed in order to complete the display device DSP (process P13 of FIG. 7).

In the method of manufacturing the display device DSP in this embodiment described above, the pixel apertures APα, APβ and APγ are formed in the insulating layer 5a (the rib 5) after the partition 6 is formed on the insulating layer 5a. If the pixel apertures APα, APβ and APγ are formed before the formation of the partition 6, the lower electrodes LEα, LEβ and LEγ are exposed to the etchant during the wet etching (see FIG. 13) for the first metal layer 611 and the second metal layer 612. At this time, if defective portions such as minute pinholes and the like are created in the first conductive oxide layer L2 of the lower electrodes LEα, LEβ and LEγ, the etchant may erode the silver layer L1 via the defective portions.

In contrast, when the pixel apertures APα, APβ and APγ are formed after the partition 6 as in this embodiment, the lower electrodes LEα, LEβ and LEγ are covered by the insulating layer 5a during the above-mentioned wet etching. Therefore, it is possible to suppress erosion of the silver layer L1 by the etchant. As a result, display errors in the display elements 20α, 20β and 20γ can be suppressed and the reliability of the display device DSP can be enhanced.

In this embodiment, the portion of the insulating layer 5a, which covers the dam portion DP and the terminal portion T as well is removed after the formation of the partition 6. Thus, it is further possible to suppress the erosion of the terminal portion T in the wet etching described above.

Moreover, in this embodiment, before forming the partition 6 and the conductive layer CL, the contact aperture APc is formed in the insulating layer 5a. Thus, it is possible to obtain a power feed structure in which the conductive layer CL and the power feed line PW are brought into contact with each other.

Apart from those described above, various other suitable advantageous effects can be obtained from this embodiment.

All of the display devices and their manufacturing methods that can be implemented by a person of ordinary skill in the art through arbitrary design changes based on the display devices and their manufacturing methods described above as the embodiment and its modified examples of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each of the above embodiments and modified examples and are self-explanatory from the descriptions of the specification or can be arbitrarily conceived by a person of ordinary skill in the art are considered to be naturally brought about by the present invention as a matter of course.

What is claimed is:

1. A method of manufacturing a display device, comprising:
   forming a first lower electrode above a substrate;
   forming an insulating layer which covers the first lower electrode;

forming a partition including a lower portion located on the insulating layer and an upper portion protruding from a side surface of the lower portion;

forming, after the forming of the partition, a first pixel aperture overlapping the first lower electrode, in the insulating layer;

forming a first organic layer in contact with the first lower electrode via the first pixel aperture;

forming a first upper electrode which covers the first organic layer; and patterning the first organic layer and the first upper electrode to form a first display element including the first lower electrode, the first organic layer and the first upper electrode.

2. The method of manufacturing a display device of claim 1, wherein
the first lower electrode includes a silver layer and a conductive oxide layer which covers the silver layer.

3. The method of manufacturing a display device of claim 1, wherein
the forming of the partition comprises:
forming a metal layer above the insulating layer; and
forming the lower portion by wet-etching the metal layer.

4. The method of manufacturing a display device of claim 3, wherein
the metal layer contain aluminum.

5. The method of manufacturing a display device of claim 3, wherein
the insulating layer is formed of an inorganic material.

6. The method of manufacturing a display device of claim 5, wherein
the insulating layer is formed of silicon nitride.

7. The method of manufacturing a display device of claim 5, wherein
the insulating layer is formed of silicon oxynitride.

8. The method of manufacturing a display device of claim 1, further comprising:
forming a first sealing layer which covers the first upper electrode,
wherein
the patterning of the first organic layer and the first upper electrode includes patterning the first sealing layer together with the first organic layer and the first upper electrode to form the first display element covered by the first sealing layer.

9. The method of manufacturing a display device of claim 1, further comprising:
forming a second lower electrode above the substrate together with the first lower electrode;
forming a second pixel aperture that overlaps the second lower electrode in the insulating layer, together with the first pixel aperture;
forming, after the forming of the first display element, a second organic layer in contact with the second lower electrode via the second pixel aperture;
forming a second upper electrode which covers the second organic layer; and
patterning the second organic layer and the second upper electrode to form a second display element including the second lower electrode, the second organic layer and the second upper electrode.

10. The method of manufacturing a display device of claim 9, further comprising:
forming a second sealing layer which covers the second upper electrode,
wherein
the patterning of the second organic layer and the second upper electrode includes patterning the second sealing layer together with the second organic layer and the second upper electrode to form the second display element covered by the second sealing layer.

11. The method of manufacturing a display device of claim 9, further comprising:
forming a third lower electrode above the substrate together with the first lower electrode and the second lower electrode;
forming a third pixel aperture which overlaps the third lower electrode, in the insulating layer together with the first pixel aperture and the second pixel aperture;
forming, after the forming of the first display element and the second display element, a third organic layer in contact with the third lower electrode via the third pixel aperture;
forming a third upper electrode which covers the third organic layer; and
patterning the third organic layer and the third upper electrode to form a third display element including the third lower electrode, the third organic layer and the third upper electrode.

12. The method of manufacturing a display device of claim 11, further comprising:
forming a third sealing layer which covers the third upper electrode,
wherein
the patterning of the third organic layer and the third upper electrode includes patterning the third sealing layer together with the third organic layer and the third upper electrode to form the third display element covered by the third sealing layer.

13. The method of manufacturing a display device of claim 1, further comprising:
forming a power feed line covered by the insulating layer in a surrounding area on an outside of a display area including the first lower electrode;
forming, before the forming of the partition, a contact aperture which overlaps the power feed line, in the insulating layer; and
forming a conductive layer in contact with the power feed line via the contact aperture together with the partition.

14. The method of manufacturing a display device of claim 1, further comprising:
forming a dam portion in a surrounding area on an outside of a display area including the first lower electrode, which surrounds the display area and is covered by the insulating layer; and
removing the insulating layer which covers the dam portion after the forming of the partition.

15. The method of manufacturing a display device of claim 1, further comprising:
forming a terminal portion covered by the insulating layer in a surrounding area on an outside of a display area including the first lower electrode; and
removing the insulating layer which covers the terminal portion after the forming of the partition.

16. A method of manufacturing a display device, comprising:
forming a lower electrode located in a display area and a power feed line located in a surrounding area on an outside of the display area above a substrate;
forming an insulating layer which covers the lower electrode and the power feed line;
forming a contact aperture which overlaps the power feed line, in the insulating layer;

forming, after the forming of the contact aperture, a partition located above the insulating layer in the display area and a conductive layer in contact with the power feed line via the contact aperture in the surrounding area;

forming, after the forming of the partition and the conductive layer, a pixel aperture which overlaps the lower electrode in the insulating layer;

forming an organic layer in contact with the lower electrode via the pixel aperture; and forming an upper electrode which covers the organic layer.

17. The method of manufacturing a display device of claim 16, wherein
the power feed line includes a silver layer and a conductive oxide layer which covers the silver layer.

18. The method for manufacturing a display device of claim 16, wherein
the forming of the partition comprises:
forming a metal layer above the insulating layer; and
wet-etching the metal layer.

19. The method of manufacturing a display device of claim 18, wherein
the metal layer contain aluminum.

* * * * *